(12) United States Patent
Li et al.

(10) Patent No.: US 9,236,453 B2
(45) Date of Patent: Jan. 12, 2016

(54) NONVOLATILE MEMORY STRUCTURE AND FABRICATION METHOD THEREOF

(71) Applicant: eMemory Technology Inc., Hsin-Chu (TW)

(72) Inventors: Yi-Hung Li, Hsinchu (TW); Yen-Hsin Lai, Taipei (TW); Ming-Shan Lo, Hsinchu (TW); Shih-Chan Huang, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/229,980

(22) Filed: Mar. 30, 2014

(65) Prior Publication Data

US 2015/0091073 A1 Apr. 2, 2015

Related U.S. Application Data

(60) Provisional application No. 61/883,205, filed on Sep. 27, 2013.

(51) Int. Cl.
*H01L 27/088* (2006.01)
*H01L 21/28* (2006.01)
(Continued)

(52) U.S. Cl.
CPC ...... *H01L 29/66833* (2013.01); *G11C 16/0416* (2013.01); *G11C 16/0441* (2013.01); *G11C 16/10* (2013.01); *G11C 16/24* (2013.01); *H01L 27/1157* (2013.01); *H01L 27/11524* (2013.01); *H01L 27/11558* (2013.01); *H01L 29/0649* (2013.01); *H01L 29/42344* (2013.01); *H01L 29/512* (2013.01); *H01L 29/66545* (2013.01); *H01L 29/788* (2013.01);

(Continued)

(58) Field of Classification Search
CPC ............... H01L 27/11524; H01L 29/7881; H01L 29/788; H01L 21/28282; H01L 29/42324; H01L 27/11517; H01L 27/11558; G11C 16/0483; G11C 13/0026; G11C 16/107; G11C 13/0028; G11C 13/003; G11C 2213/34; G11C 2213/78; G11C 2216/10
USPC .................................................. 257/310–320
See application file for complete search history.

(56) References Cited

U.S. PATENT DOCUMENTS 5,898,619 A * 4/1999 Chang et al. ............. 365/185.23
2010/0112799 A1* 5/2010 Jeong ................ H01L 21/28273
438/591

(Continued)

FOREIGN PATENT DOCUMENTS

JP 2006186042 A 7/2006
JP 20084718 A 1/2008
(Continued)

*Primary Examiner* — Howard Weiss
*Assistant Examiner* — Nelson Garces
(74) *Attorney, Agent, or Firm* — Winston Hsu; Scott Margo

(57) ABSTRACT

According to one embodiment, a single-poly nonvolatile memory (NVM) cell includes a PMOS select transistor on a semiconductor substrate and a PMOS floating gate transistor series connected to the PMOS select transistor. The PMOS floating gate transistor comprises a floating gate and a gate oxide layer between the floating gate and the semiconductor substrate. A protector oxide layer covers and is in direct contact with the floating gate. A contact etch stop layer is disposed on the protector oxide layer such that the floating gate is isolated from the contact etch stop layer by the protector oxide layer.

10 Claims, 9 Drawing Sheets

| (51) | Int. Cl. | |
|---|---|---|
| | H01L 29/788 | (2006.01) |
| | H01L 21/336 | (2006.01) |
| | G11C 16/04 | (2006.01) |
| | H01L 29/66 | (2006.01) |
| | H01L 27/115 | (2006.01) |
| | H01L 29/51 | (2006.01) |
| | H01L 29/792 | (2006.01) |
| | H01L 29/06 | (2006.01) |
| | H01L 29/423 | (2006.01) |
| | G11C 16/10 | (2006.01) |
| | G11C 16/24 | (2006.01) |

(52) U.S. Cl.
CPC ......... *H01L 29/7881* (2013.01); *H01L 29/792* (2013.01); *G11C 2216/10* (2013.01)

(56) References Cited

U.S. PATENT DOCUMENTS

| 2011/0044112 | A1* | 2/2011 | Torii | 365/185.18 |
| 2012/0074482 | A1* | 3/2012 | Jung | H01L 21/28273 257/316 |
| 2012/0181607 | A1* | 7/2012 | Ryu | H01L 21/28273 257/337 |
| 2013/0020625 | A1* | 1/2013 | Shih et al. | 257/315 |
| 2013/0248973 | A1 | 9/2013 | Chen | |
| 2014/0252445 | A1* | 9/2014 | Chen | H01L 21/28273 257/316 |

FOREIGN PATENT DOCUMENTS

| JP | 2008166599 A | 7/2008 |
| JP | 2009239161 A | 10/2009 |
| JP | 201123567 A | 2/2011 |

* cited by examiner

NONVOLATILE MEMORY STRUCTURE AND FABRICATION METHOD THEREOF

CROSS REFERENCE TO RELATED APPLICATIONS

This application claims priority from U.S. provisional application No. 61/883,205 filed Sep. 27, 2013.

BACKGROUND OF THE INVENTION

1. Field of the Invention

The present invention relates generally to the field of nonvolatile memory devices. More particularly, the present invention relates to a single-poly nonvolatile memory cell structure with improved data retention.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies.

For example, U.S. Pat. No. 6,678,190 discloses a single-poly NVM having two serially connected PMOS transistors wherein the control gate is omitted in the structure for layout as the bias is not necessary to apply to the floating gate during the programming mode. A first PMOS transistor acts as a select transistor. A second PMOS transistor is connected to the first PMOS transistor. A gate of the second PMOS transistor serves as a floating gate. The floating gate is selectively programmed or erased to store predetermined charges.

It is desirable that the charge stored on a floating gate is retained for as long as possible, thereby increasing the data retention time of the NVM.

SUMMARY OF THE INVENTION

It is one object of the invention to provide an improved single-poly nonvolatile memory cell structure with improved data retention.

According to one embodiment, a single-poly nonvolatile memory (NVM) cell includes a PMOS select transistor on an N well of a semiconductor substrate and a PMOS floating gate transistor series connected to the PMOS select transistor. The PMOS select transistor comprises a select gate, a first gate oxide layer between the select gate and the semiconductor substrate, a first sidewall spacer provided on either sidewall of the select gate, a first P-type source/drain doping region in the N well, and a second P-type source/drain doping region spaced apart from the first P-type source/drain doping region. The PMOS floating gate transistor comprises a floating gate, a second gate oxide layer between the floating gate and the semiconductor substrate, a second sidewall spacer provided on either sidewall of the floating gate, the second P-type source/drain doping region commonly shared by the PMOS select transistor, and a third P-type source/drain doping region spaced apart from the second P-type source/drain doping region.

A first self-aligned silicide (salicide) layer is disposed on the first P-type source/drain doping region. A second salicide layer is disposed on the second P-type source/drain doping region. The second salicide layer is contiguous with an edge of a bottom of the first sidewall spacer, but is kept a predetermined distance from an edge of a bottom of the second sidewall spacer. A protector oxide layer covers and is indirect contact with the floating gate. A contact etch stop layer is disposed on the protector oxide layer such that the floating gate is isolated from the contact etch stop layer by the protector oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
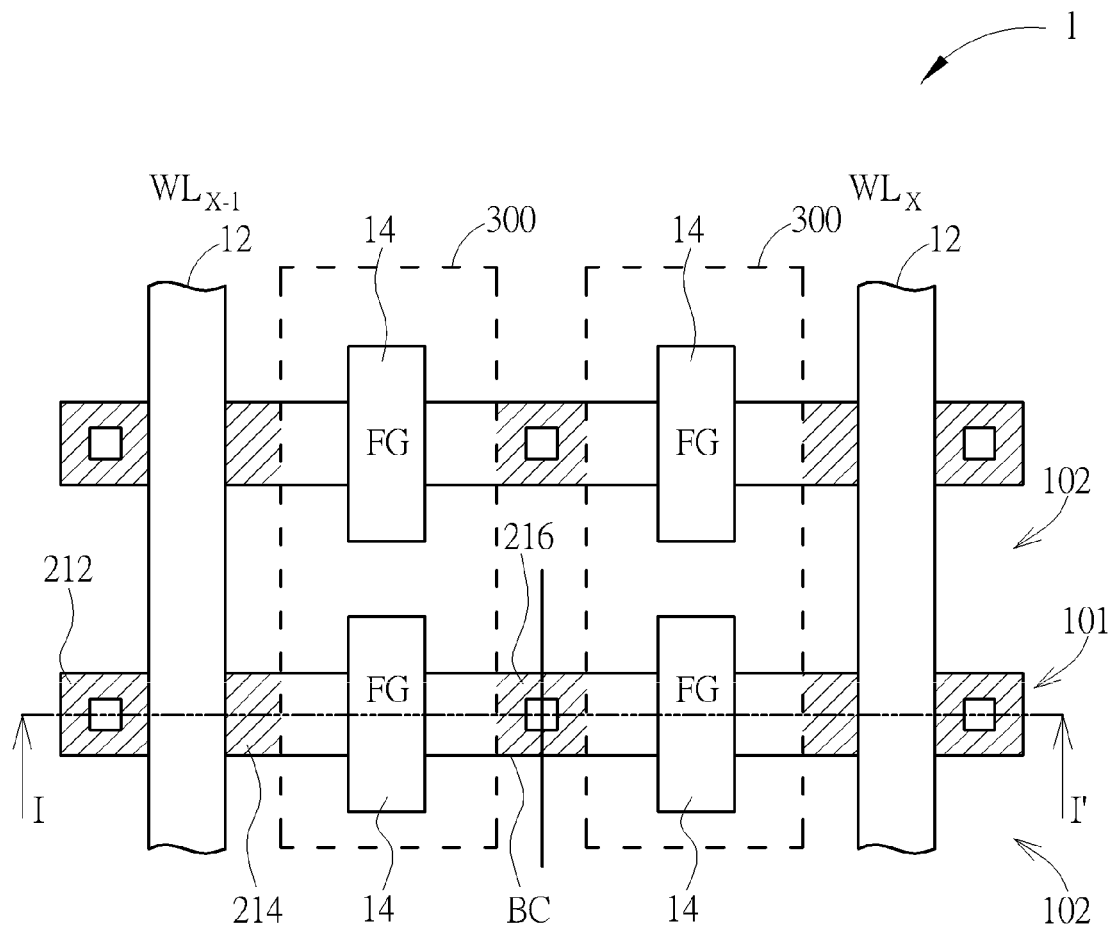
FIG. 1 is a schematic plan view of a portion of a nonvolatile memory layout according to one embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Figure 2:
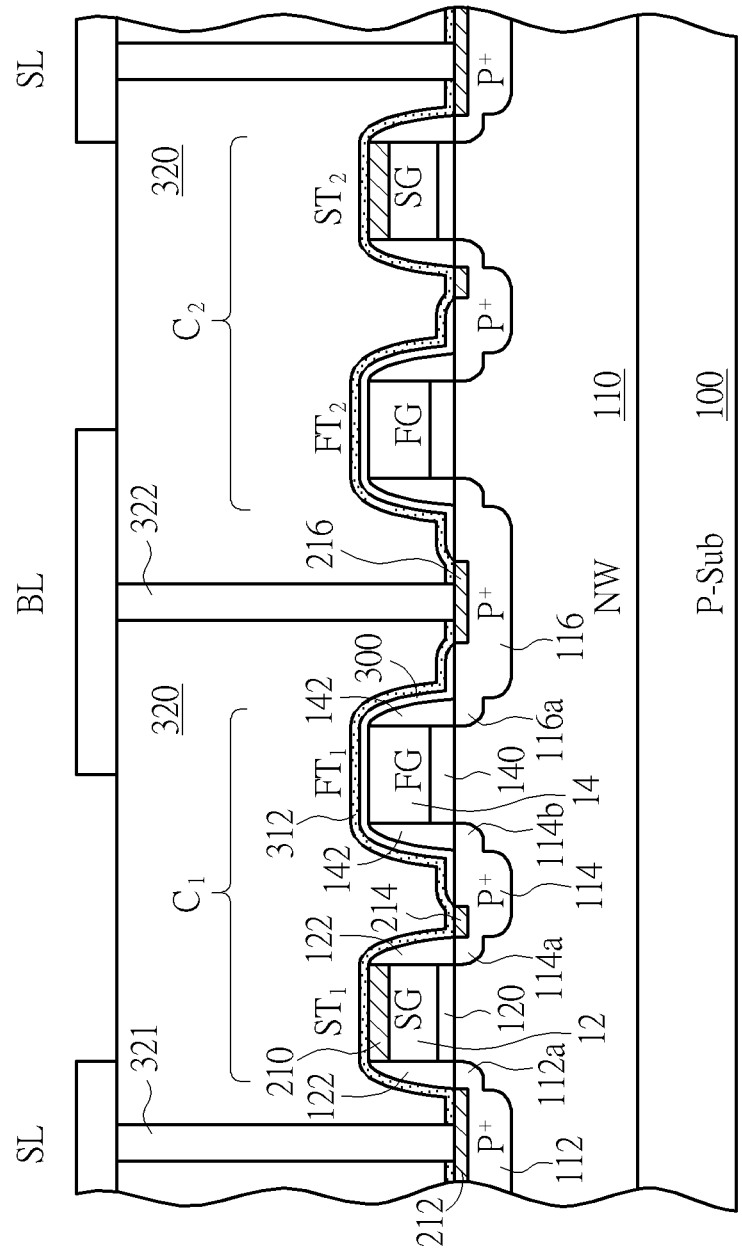
FIG. 2 is a schematic, cross-sectional view taken along line I-I' of FIG. 1.

Please refer to FIG. 1 and FIG. 2. FIG. 1 is a schematic plan view of a portion of a single-poly nonvolatile memory (NVM) according to one embodiment of the invention. FIG. 2 is a schematic, cross-sectional view taken along line I-I' of FIG. 1. As shown in FIG. 1 and FIG. 2, a plurality of line-shaped active areas 101 elongating along a first direction (i.e. the reference x-axis) are provided in a semiconductor substrate 100 such as a P-type silicon substrate (P-Sub). The active areas 101 are isolated from one another by shallow trench isolation (STI) regions 102 interposed between the active areas 101. In FIG. 1, only two rows of active areas 101 are shown. A plurality of word lines 12 (e.g. $WL_{x-1}$ and $WL_x$ in FIG. 1) are formed on the main surface of the semiconductor substrate 100. The word lines 12 extend along a second direction (i.e. the reference y-axis) and intersect the active areas 101 to form select transistors (ST) at the intersections. Each of the word lines 12 also acts as a select gate (SG) of the respective select transistor. In FIG. 1, only two columns of word lines 12 are shown for the sake of simplicity. According to the embodiment, the first direction is orthogonal to the second direction.

The single-poly NVM 1 further comprises a plurality of floating gate segments 14 for charge storage, which are disposed along each of the active areas 101 between the word lines 12 such that only two floating gate segments 14 or two floating gate transistors (FT) are arranged between two adjacent word lines 12. For example, two mirror-symmetrical NVM cells: $C_1$ and $C_2$ of the same row are labeled in FIG. 1 and FIG. 2 on the active area 101. The NVM cell $C_1$ comprises a select transistor $ST_1$ and a floating gate transistor $FT_1$ that is series connected to the select transistor $ST_1$. Likewise, the NVM cell $C_2$ comprises a select transistor $ST_2$ and a floating gate transistor $FT_2$ that is series connected to the select transistor $ST_2$. The NVM cell $C_1$ and NVM cell $C_2$ share the same bit line contact (BC) region.

As shown in FIG. 2, for example, the select transistor $ST_1$ comprises a select gate (SG) 12, a gate oxide layer 120 between the select gate (SG) 12 and the semiconductor substrate 100, a sidewall spacer 122 provided on either sidewall of the select gate (SG) 12, a P-type source/drain doping region 112 in an N well (NW) 110, a P-type lightly doped drain (PLDD) region 112a merged with the P-type source/drain doping region 112, a P-type source/drain doping region 114 spaced apart from the P-type source/drain doping region 112, and a PLDD region 114a merged with the P-type source/drain doping region 114. In operation, a P-type channel may be formed between the PLDD region 112a and the PLDD region 114a underneath the select gate (SG) 12. The floating gate transistor $FT_1$ comprises a floating gate (FG) 14, a gate oxide layer 140 between the floating gate (FG) 14 and the semiconductor substrate 100, a sidewall spacer 142 is provided on either sidewall of the floating gate (FG) 14, the P-type source/drain doping region 114, a PLDD region 114b merged with the P-type source/drain doping region 114, a P-type source/drain doping region 116 spaced apart from the P-type source/drain doping region 114, and a PLDD region 116a merged with the P-type source/drain doping region 116. The P-type source/drain doping region 114 is shared by the select transistor $ST_1$ and the floating gate transistor $FT_1$. According to the embodiment, the select gate (SG) 12 and the floating gate (FG) 14 are made of single-layer polysilicon, which is fully compatible with logic processes.

According to the embodiment, the thickness of the gate oxide layer 140 of the floating gate transistor $FT_1$ may be thicker than the gate oxide layer of the logic transistor devices, for example, those transistor devices in the peripheral circuit of the same memory chip. The thicker gate oxide layer 140 may improve the data retention of the single-poly NVM 1. In another embodiment, the thickness of the gate oxide layer 140 may be the same with the thickness of the gate oxide layer 120.

A self-aligned silicide (salicide) layer 212 is provided on the P-type source/drain doping region 112. The self-aligned silicide layer 212 extends to the edge of the bottom of the sidewall spacer 122. On the opposite side of the select gate (SG) 12, a self-aligned silicide layer 214 is provided on the P-type source/drain doping region 114. The self-aligned silicide layer 214 is contiguous with the edge of the bottom of the sidewall spacer 122, but is kept a predetermined distance from the edge of the bottom of the sidewall spacer 142. In other words, the self-aligned silicide layer 212 covers the entire surface area of the P-type source/drain doping region 112, while the self-aligned silicide layer 214 covers only a portion of the surface area of the P-type source/drain doping region 114 adjacent to the sidewall spacer 122, and the self-aligned silicide layer 214 is spaced apart from the edge of the spacer 142. Likewise, on the opposite side of the floating gate (FG) 14, a self-aligned silicide layer 216 is provided on the P-type source/drain doping region 116. The self-aligned silicide layer 216 is kept a predetermined distance from the edge of the bottom of the spacer 142. A self-aligned silicide layer 210 is provided on the top surface of the select gate (SG) 12. It is noteworthy that no silicide layer is formed on the top surface of the floating gate (SG) 14.

A protector oxide layer 300 is provided to cover the floating gate (FG) 14. According to the embodiment, the protector oxide layer 300 may comprise silicon oxide, but not limited thereto. The protector oxide layer 300 covers the top surface of the floating gate (FG) 14, the surfaces of the spacers 142, a portion of the surface of the P-type source/drain doping region 114, and a portion of the P-type source/drain doping region 116. The aforesaid self-aligned silicide layers 214 and 216 are formed only on the surface area of the P-type source/drain doping regions 114 and 116 not covered by the protector oxide layer 300. The predetermined area covered by the protector oxide layer 300 is shown in FIG. 1 indicated with dashed line.

The non-salicided region in the P-type source/drain doping region 114 between the spacer 142 and the self-aligned silicide layer 214, and the non-salicided region in the P-type source/drain doping region 116 between the spacer 142 and the self-aligned silicide layer 216 can reduce defect induced BTB (band-to-band) tunneling disturbance.

A conformal contact etch stop layer (CESL) 312 is then deposited over the protector oxide layer 300 to cover the select gate (SG) 12, the floating gate (FG) 14, the self-aligned silicide layers 212, 214, and 216. According to the embodiment, the conformal contact etch stop layer (CESL) 312 is a silicon nitride layer and may be deposited by using a plasma enhanced chemical vapor deposition (PECVD) process. The silicon to nitride ratio in the conformal contact etch stop layer (CESL) 312 is adjusted (e.g. by tuning the $SiH_4/NH_3$ ratio in the reaction chamber) to reduce the electron trapping ability thereof. It is noteworthy that the contact etch stop layer (CESL) 312 is not in direct contact with the floating gate (FG) 14 or the spacer 142 because of the protector oxide layer 300. By isolating the floating gate (FG) 14 from the contact etch stop layer (CESL) 312 with the protector oxide layer 300, the data retention characteristic of the single-poly NVM 1 is much improved.

An inter-layer dielectric (ILD) layer 320 is deposited on the contact etch stop layer (CESL) 312. The inter-layer dielectric layer 320 is thicker than the contact etch stop layer (CESL) 312 and is deposited to completely fill the space between the select gate (SG) 12 and the floating gate (FG) 14. A chemical mechanical polishing (CMP) process may be carried out, if necessary, to planarize the top surface of the inter-layer dielectric layer 320. A source line contact 321 and a bit line contact 322 are formed in the inter-layer dielectric layer 320. A source line (SL) and a bit line (BL) may be defined in the first metal layer (ML$_1$) to respectfully connect to the source line contact 321 and the bit line contact 322.

Figure 3:
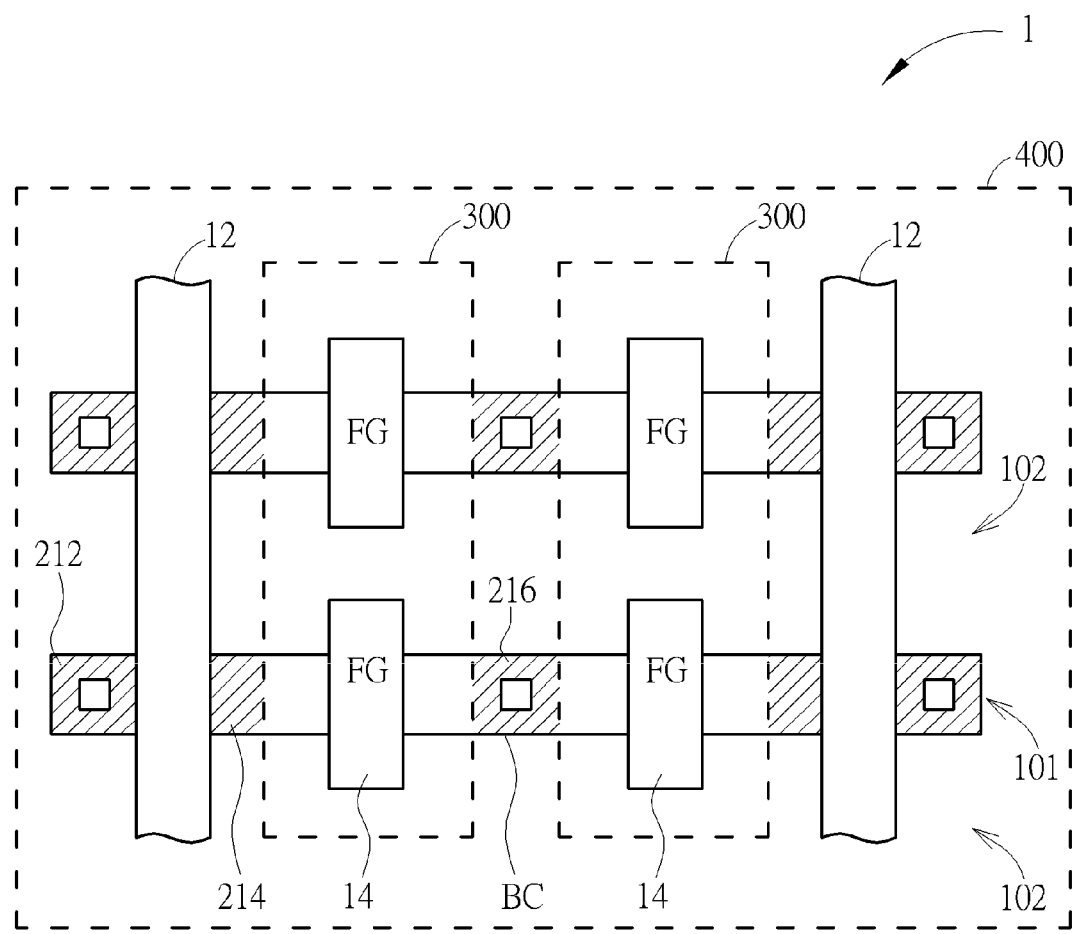
FIG. 3 is a schematic plan view of a portion of a nonvolatile memory layout according to another embodiment of the invention, wherein an additional UV blocking layer is provided.

Please refer to FIG. 3. FIG. 3 is a schematic plan view of a portion of a nonvolatile memory layout according to another embodiment of the invention. As shown in FIG. 3, the layout of the memory cells is similar to that as depicted in FIG. 1 except for that in order to further enhance the data retention of the single-poly NVM 1 when used as an one-time program (OTP) memory, an additional ultraviolet (UV) blocking layer 400 may be disposed within the memory array region to at least completely cover or be disposed directly above the floating gate (FG) 14. The UV blocking layer 400 may be any layer in the dielectric films deposited on the substrate 100, which has the ability to block or scatter UV radiation. For example, the UV blocking layer 400 may be a silicon nitride layer in the passivation structure or a dummy metal layer. The aforesaid silicon nitride layer in the passivation structure may be deposited by using PECVD methods or LPCVD methods, and may have a refractive index that is greater than a predetermined value.

Figure 4:
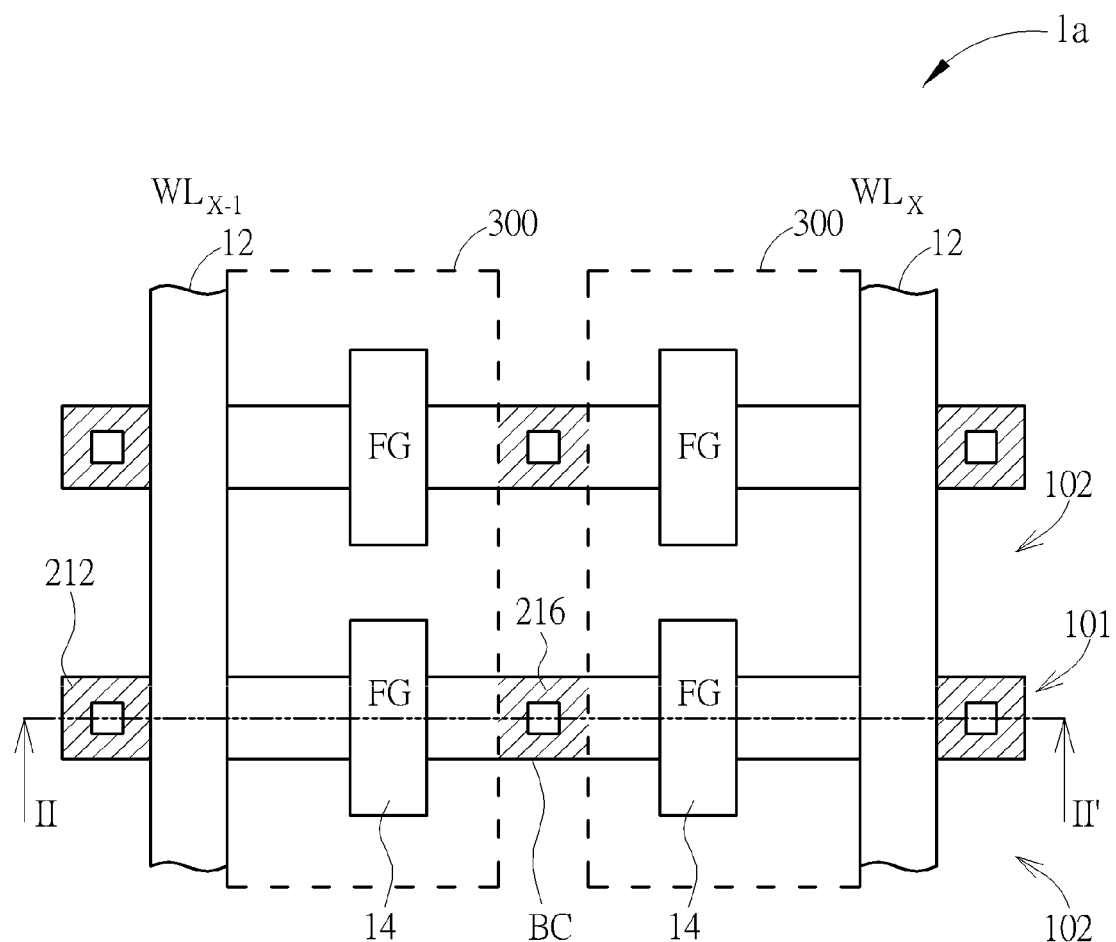
FIG. 4 is a schematic plan view of a portion of a NVM layout according to another embodiment of the invention.
Figure 5:
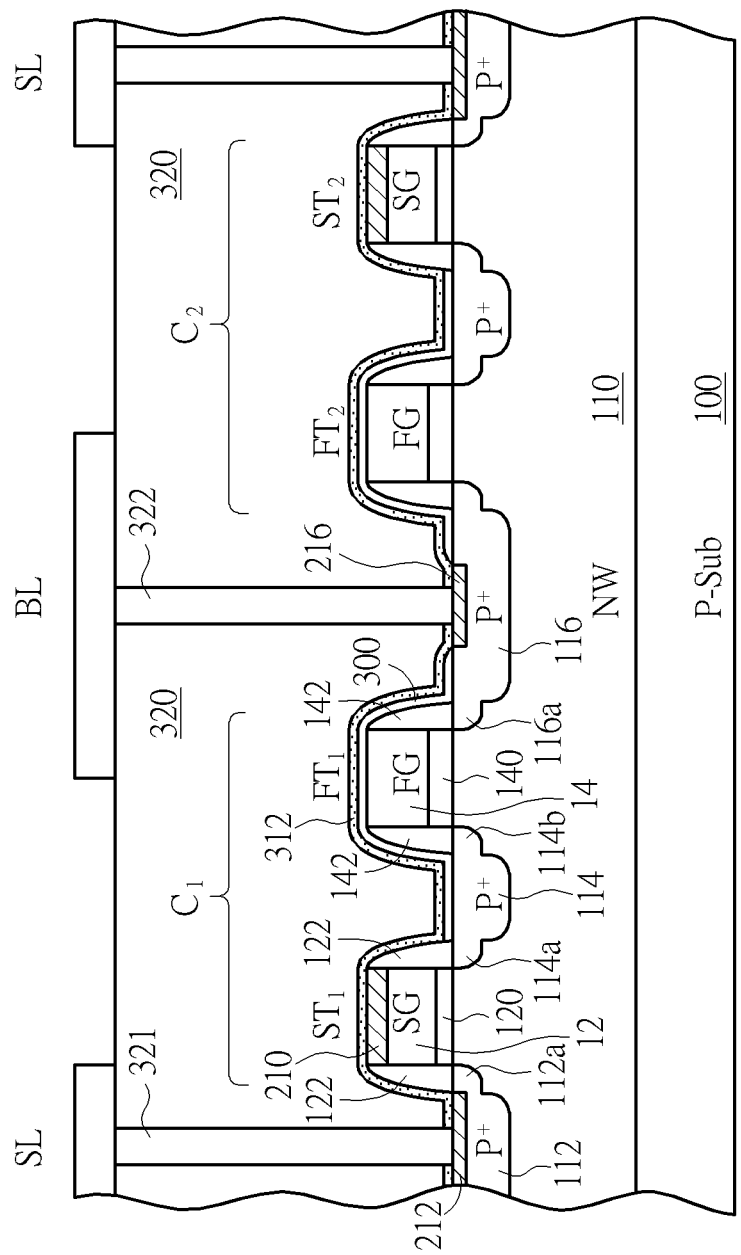
FIG. 5 is a schematic, cross-sectional view taken along line II-II' of FIG. 4.

Please refer now to FIG. 4 and FIG. 5. FIG. 4 is a schematic plan view of a portion of a NVM layout according to another embodiment of the invention. FIG. 5 is a schematic, cross-sectional view taken along line II-II' of FIG. 4. As shown in FIG. 4 and FIG. 5, likewise, a plurality of line-shaped active areas 101 elongating along a first direction (i.e. the reference x-axis) are provided in a semiconductor substrate 100 such as a P-type silicon substrate (P-Sub). The active areas 101 are isolated from one another by shallow trench isolation (STI) regions 102 interposed between the active areas 101. In FIG. 4, only two rows of active areas 101 are shown. A plurality of word lines 12 (e.g. WL$_{x-1}$ and WL$_x$ in FIG. 4) are formed on the main surface of the semiconductor substrate 100. The word lines 12 extend along a second direction (i.e. the reference y-axis) and intersect the active areas 101 to form select transistors (ST) at the intersections. Each of the word lines 12 also acts as a select gate (SG) of the respective select transistor. In FIG. 4, only two columns of word lines 12 are shown for the sake of simplicity. According to the embodiment, the first direction is orthogonal to the second direction.

The single-poly NVM 1a further comprises a plurality of floating gate segments 14 for charge storage, which are disposed along each of the active areas 101 between the word lines 12 such that only two floating gate segments 14 or two floating gate transistors (FT) are arranged between two adjacent word lines 12. For example, two mirror-symmetrical NVM cells: C$_1$ and C$_2$ of the same row are labeled in FIG. 4 and FIG. 5 on the active area 101. The NVM cell C$_1$ comprises a select transistor ST$_1$ and a floating gate transistor FT$_1$ that is series connected to the select transistor ST$_1$. Likewise, the NVM cell C$_2$ comprises a select transistor ST$_2$ and a floating gate transistor FT$_2$ that is series connected to the select transistor ST$_2$. The NVM cell C$_1$ and NVM cell C$_2$ share the same bit line contact (BC) region.

As shown in FIG. 5, the select transistor ST$_1$ comprises a select gate (SG) 12, a gate oxide layer 120 between the select gate (SG) 12 and the semiconductor substrate 100, a sidewall spacer 122 is provided on either sidewall of the select gate (SG) 12, a P-type source/drain doping region 112 in an N well (NW) 110, a PLDD region 112a merged with the P-type source/drain doping region 112, a P-type source/drain doping region 114 spaced apart from the P-type source/drain doping region 112, and a PLDD region 114a merged with the P-type source/drain doping region 114. In operation, a P-type channel may be formed between the PLDD region 112a and the PLDD region 114a underneath the select gate (SG) 12. The floating gate transistor FT$_1$ comprises a floating gate (FG) 14, a gate oxide layer 140 between the floating gate (FG) 14 and the semiconductor substrate 100, a sidewall spacer 142 is provided on either sidewall of the floating gate (FG) 14, the P-type source/drain doping region 114, a PLDD region 114b merged with the P-type source/drain doping region 114, a P-type source/drain doping region 116 spaced apart from the P-type source/drain doping region 114, and a PLDD region 116a merged with the P-type source/drain doping region 116. The P-type source/drain doping region 114 is shared by the select transistor ST$_1$ and the floating gate transistor FT$_1$. According to the embodiment, the select gate (SG) 12 and the floating gate (FG) 14 are made of single-layer polysilicon, which is fully compatible with logic processes.

A self-aligned silicide layer 212 is provided on the P-type source/drain doping region 112. The self-aligned silicide layer 212 extends to the edge of the bottom of the sidewall spacer 122. On the opposite side of the select gate (SG) 12, no self-aligned silicide layer is provided on the P-type source/drain doping region 114. A self-aligned silicide layer 216 is provided on the P-type source/drain doping region 116. The self-aligned silicide layer 216 is kept a predetermined distance from the edge of the bottom of the sidewall spacer 142. A self-aligned silicide layer 210 is provided on the top surface of the select gate (SG) 12. It is noteworthy that no silicide layer is formed on the top surface of the floating gate (SG) 14.

A protector oxide layer 300 is provided to cover the floating gate (FG) 14. According to the embodiment, the protector oxide layer 300 may comprise silicon oxide, but not limited thereto. The protector oxide layer 300 covers and is in direct contact with the top surface of the floating gate (FG) 14, the surfaces of the sidewall spacers 142, the entire surface of the P-type source/drain doping region 114, and only a portion of the P-type source/drain doping region 116. The aforesaid self-aligned silicide layer 216 is formed only on the surface area of the P-type source/drain doping region 116 not covered by the protector oxide layer 300. The predetermined area covered by the protector oxide layer 300 is shown in FIG. 4 indicated with dashed line. The source/drain doping region 114 is completely covered by the protector oxide layer 300 according to the embodiment.

A conformal contact etch stop layer (CESL) 312 is deposited over the protector oxide layer 300 to cover the select gate (SG) 12, the floating gate (FG) 14, the self-aligned silicide layers 212 and 216. According to the embodiment, the conformal contact etch stop layer (CESL) 312 may be a silicon nitride layer and may be deposited by using a plasma enhanced chemical vapor deposition (PECVD) process. The silicon to nitride ratio in the conformal contact etch stop layer (CESL) 312 is adjusted (e.g. by tuning the SiH$_4$/NH$_3$ ratio in the reaction chamber) to reduce the electron trapping ability thereof. It is understood that the conformal contact etch stop layer (CESL) 312 may be any suitable material having reduced electron trapping ability, and is not limited to the aforesaid example. It is noteworthy that the contact etch stop layer (CESL) 312 is not in direct contact with the floating gate (FG) 14 or the sidewall spacer 142 because of the protector oxide layer 300. By isolating the floating gate (FG) 14 from the contact etch stop layer (CESL) 312 with the protector oxide layer 300, the data retention characteristic of the single-poly NVM 1a is much improved.

An inter-layer dielectric (ILD) layer 320 is deposited on the contact etch stop layer (CESL) 312. The inter-layer dielectric layer 320 is thicker than the contact etch stop layer (CESL) 312 and is deposited to completely fill the space between the select gate (SG) 12 and the floating gate (FG) 14. A chemical mechanical polishing (CMP) process may be carried out, if necessary, to planarize the top surface of the inter-layer dielectric layer 320. A source line contact 321 and a bit line contact 322 are formed in the inter-layer dielectric layer 320 to electrically connected to the P-type source/drain doping region 112 and P-type source/drain doping region 116 respectively. A source line (SL) and a bit line (BL) may be defined in the first metal layer ($ML_1$) to respectfully connect to the source line contact 321 and the bit line contact 322.

Figure 6:
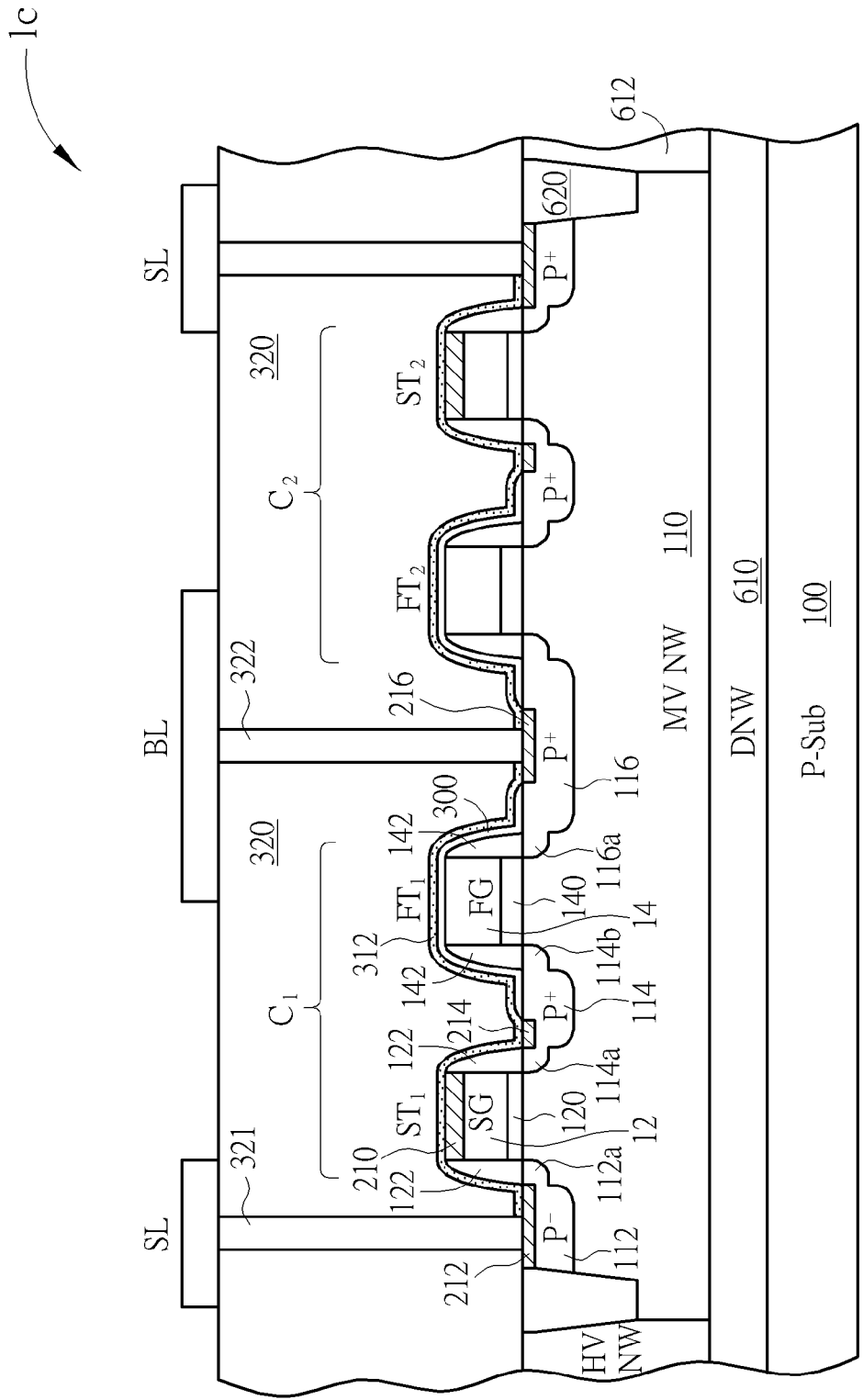
FIG. 6 and FIG. 7 are schematic, cross-sectional diagrams showing single-poly NVM cells, which are compatible with high-voltage processes.
Figure 7:
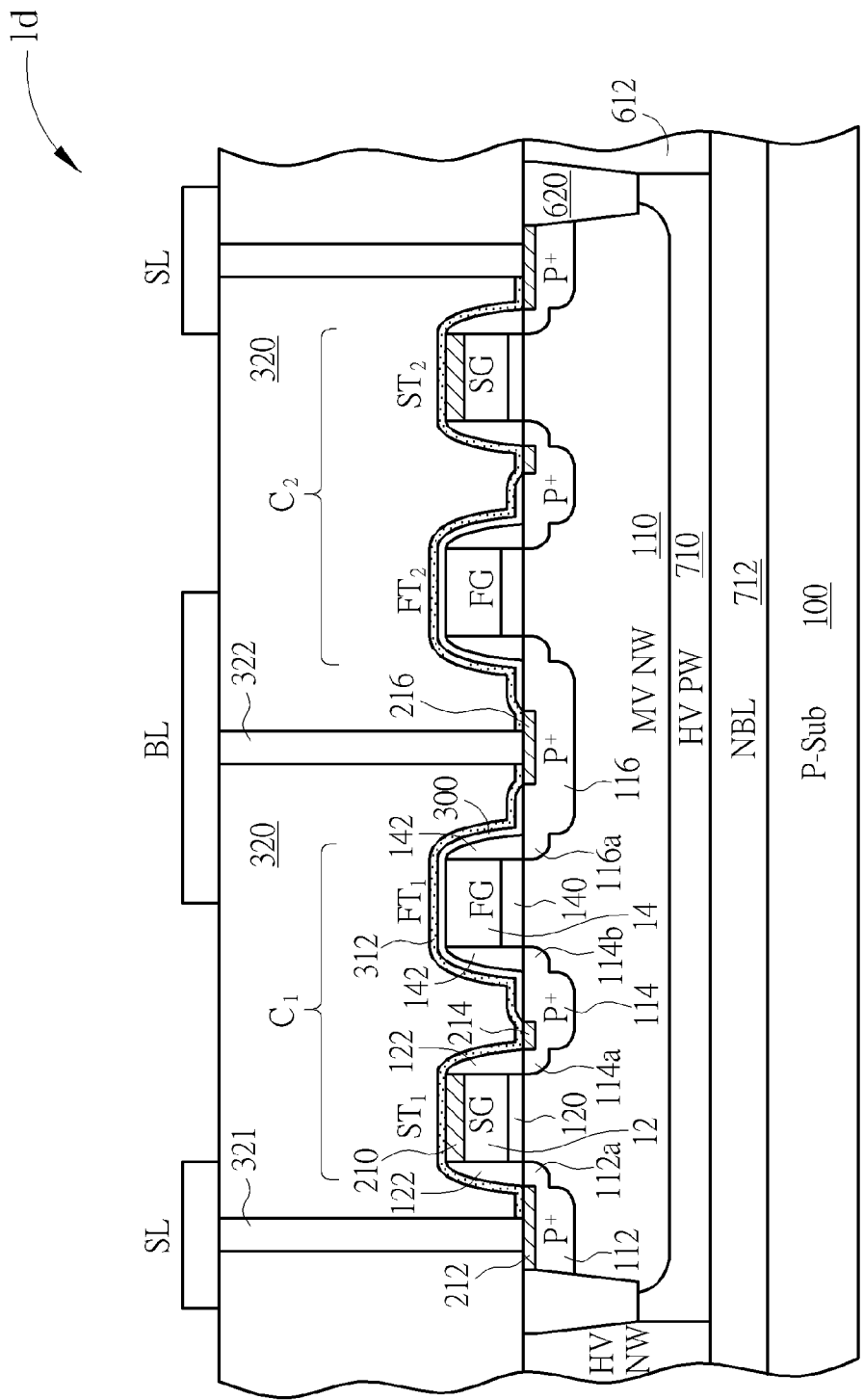

Please refer to FIG. 6 and FIG. 7. FIG. 6 and FIG. 7 are schematic, cross-sectional diagrams showing single-poly NVM cells in accordance with other embodiments, which are compatible with high-voltage processes. As shown in FIG. 6, the single-poly NVM 1c comprises a deep N well (DNW) 610 added under the N well 110. According to the embodiment, the N well 110 may be a medium-voltage N well (MVNW). A high-voltage N well (HVNW) 612 is provided in the semiconductor substrate 100 and is merged with the deep N well 610. The high-voltage N well (HVNW) 612 is isolated from the single-poly NVM cell string by an STI region 620.

As shown in FIG. 7, the single-poly NVM 1d is different from the single-poly NVM 1c of FIG. 6 in that an N-type buried layer (NBL) 712 is provided under the high-voltage N well (HVPW) 612. A high-voltage P well (HVPW) 710 is provided between the N-type buried layer (NBL) 712 and the medium-voltage N well (MVNW) 110.

Figure 8:
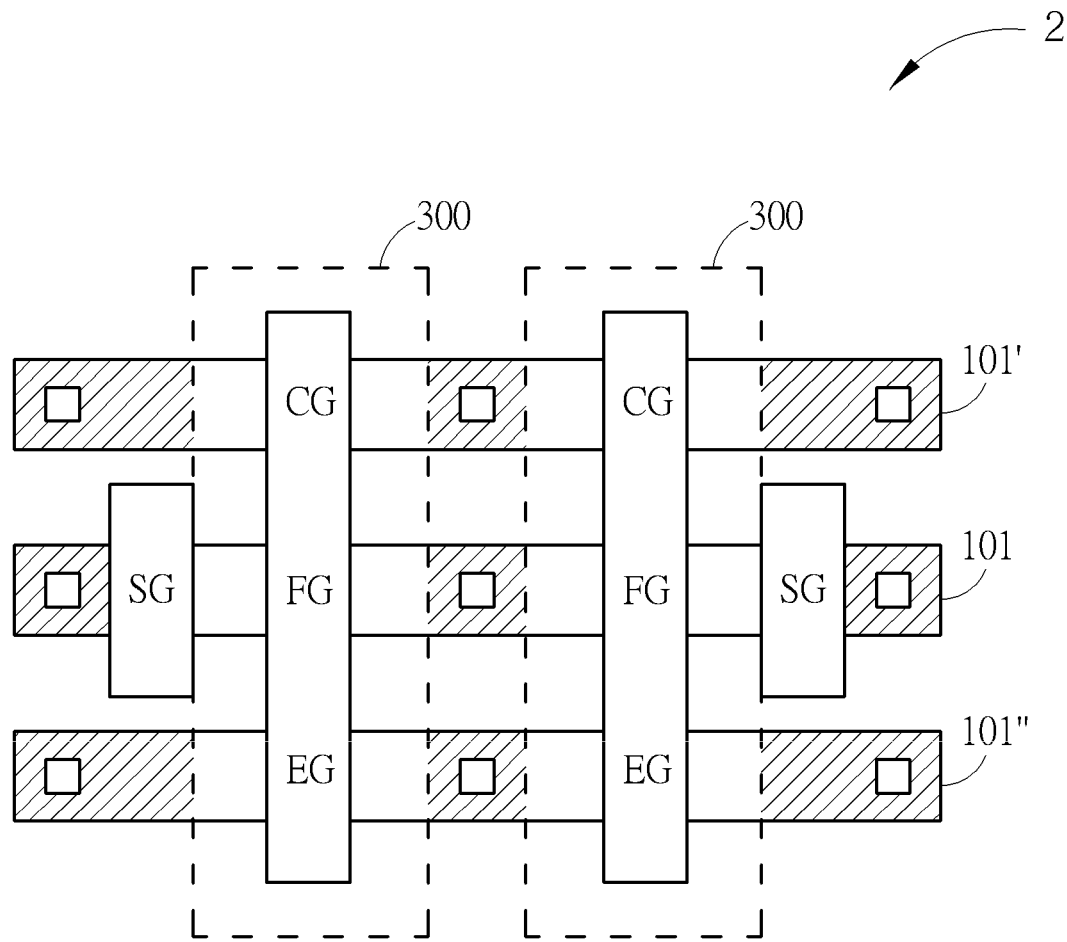
FIG. 8 is a schematic layout diagram showing yet another embodiment of the invention.

Please refer to FIG. 8. FIG. 8 is a schematic layout diagram showing yet another embodiment of the invention. As shown in FIG. 8, an exemplary multiple-time programmable (MTP) memory is illustrated. The floating gate (FG) of the MTP memory may extend in the second direction (i.e. the reference y-axis) to capacitively couple to the adjacent active areas 101' and 101", thereby forming a control gate (CG) region and an erase gate (EG) region, respectively. Likewise, the protector oxide layer 300 is provided to completely cover the floating gate (FG), the control gate (CG) region, and the erase gate (EG) region. The above-described extending device may be an NMOS FET, a PMOS FET, an N-type MOS capacitor, or a P-type MOS capacitor. The aforesaid floating gate (FG), the control gate (CG) region, and the erase gate (EG) region disposed along the same floating poly strip can improve charge retention performance by using the above-disclosed techniques.

Figure 9:
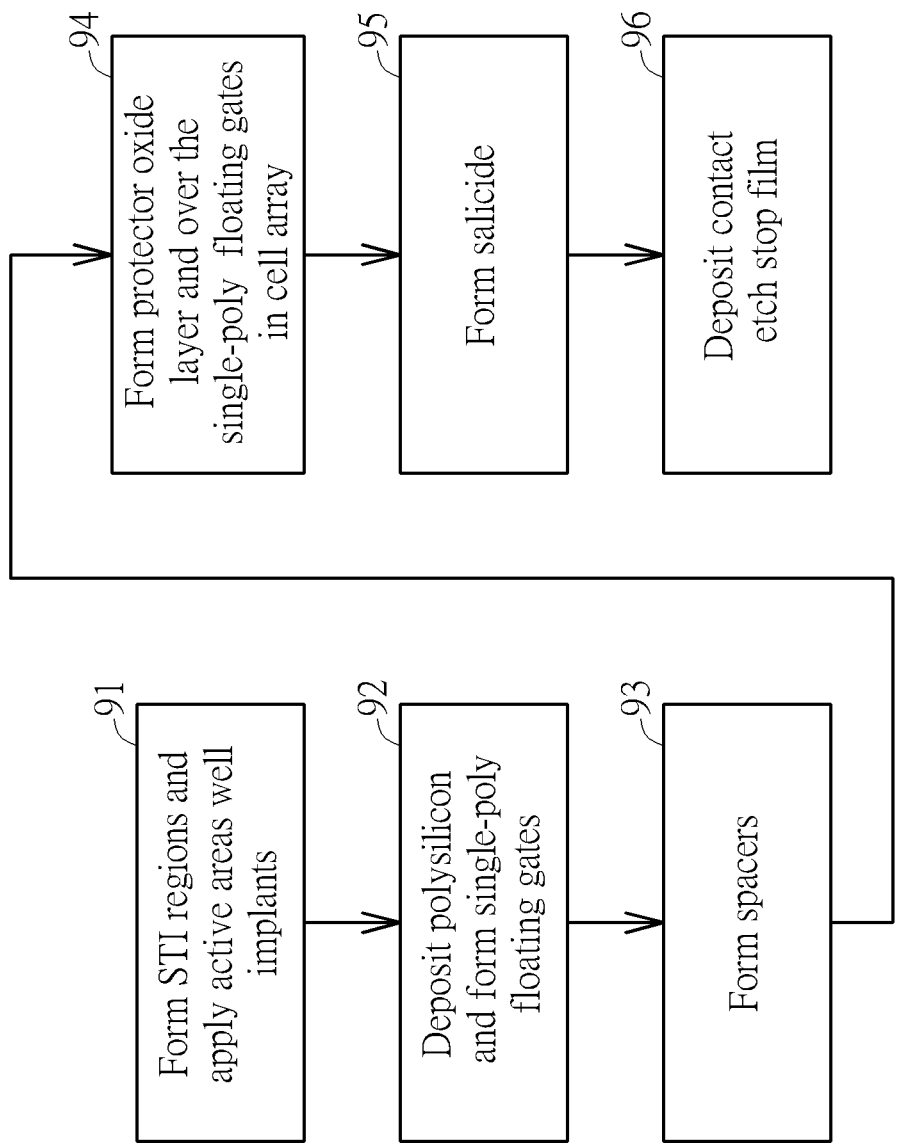
FIG. 9 is a process flow diagram illustrating the major stages of fabricating the single-poly nonvolatile memory (NVM) according to the invention.

FIG. 9 is a process flow diagram illustrating the major stages of fabricating the single-poly nonvolatile memory (NVM) according to the invention. As shown in FIG. 9, in Step 91, STI regions and active areas are formed on the semiconductor substrate. Thereafter, well implants are performed to form well structure in the semiconductor substrate. In Step, 92, a polysilicon layer is deposited and is then patterned into singl-poly floating gates. In Step 93, spacers are formed on the sidewalls of the gates. In Step 94, a protector oxide layer is formed over the single-poly floating gates in the cell array. In Step 95, a silicide layer is formed on the source/drain regions. In Step 96, a contact etch stop layer (CESL) is then deposited.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-poly nonvolatile memory (NVM) cell, comprising:
   a select transistor on a first well of a semiconductor substrate, wherein the select transistor comprises a select gate, a first gate oxide layer between the select gate and the semiconductor substrate, a first source/drain doping region in the first well, and a second source/drain doping region spaced apart from the first source/drain doping region;
   a floating gate transistor on the first well serially connected to the select transistor, wherein the PMOS floating gate transistor comprises a floating gate, a second gate oxide layer between the floating gate and the semiconductor substrate, the second source/drain doping region commonly shared by the select transistor, and a third source/drain doping region spaced apart from the second source/drain doping region;
   a first salicide layer on the first source/drain doping region;
   a protector oxide layer covering and being in direct contact with the floating gate;
   a contact etch stop layer on the protector oxide layer such that the floating gate is isolated from the contact etch stop layer by the protector oxide layer;
   a first sidewall spacer provided on either sidewall of the select gate;
   a second sidewall spacer provided on either sidewall of the floating gate; and
   a second salicide layer on the second source/drain doping region, wherein the second salicide layer is contiguous with an edge of a bottom of the first sidewall spacer, but is kept a predetermined distance from an edge of a bottom of the second sidewall spacer.

2. The single-poly NVM cell according to claim 1 further comprising a third salicide layer on the third source/drain doping region, wherein the third salicide layer is kept a predetermined distance from an edge of a bottom of the second sidewall spacer.

3. The single-poly NVM cell according to claim 2 further comprising a fourth salicide layer on a top surface of the select gate.

4. The single-poly NVM cell according to claim 1 wherein no silicide layer is formed on a top surface of the floating gate.

5. The single-poly NVM cell according to claim 1 further comprising an inter-layer dielectric layer on the contact etch stop layer.

6. The single-poly NVM cell according to claim 5 further comprising a source line contact and a bit line contact in the inter-layer dielectric layer to electrically connected to the first source/drain doping region and the third source/drain doping region respectively.

7. The single-poly NVM cell according to claim 1 wherein the protector oxide layer is a silicon oxide layer.

8. The single-poly NVM cell according to claim 1 wherein the protector oxide layer covers and is in direct contact with a top surface of the floating gate, surfaces of the second sidewall spacers, only a portion of the second source/drain doping region, and only a portion of the third source/drain doping region.

9. The single-poly NVM cell according to claim 2 wherein the third salicide layer is formed only on the surface area of the third source/drain doping region not covered by the protector oxide layer.

10. The single-poly NVM cell according to claim 1 wherein the second gate oxide layer is thicker than the first gate oxide layer.

* * * * *